United States Patent [19]
Diem et al.

[11] Patent Number: 5,495,761
[45] Date of Patent: Mar. 5, 1996

[54] INTEGRATED ACCELEROMETER WITH A SENSITIVE AXIS PARALLEL TO THE SUBSTRATE

[75] Inventors: Bernard Diem, Echirolles; France Michel, Sassenage, both of France

[73] Assignee: Commissariat a l'Energie Atomique, Paris, France

[21] Appl. No.: 171,642

[22] Filed: Dec. 22, 1993

[30] Foreign Application Priority Data

Dec. 28, 1992 [FR] France .................................. 92 15770

[51] Int. Cl.⁶ .............................................. G01P 15/125
[52] U.S. Cl. ..................... 73/514.32; 73/514.36
[58] Field of Search ............................... 361/280, 283.3; 73/514.32, 514.36

[56] References Cited

U.S. PATENT DOCUMENTS

| | | | |
|---|---|---|---|
| 4,653,326 | 3/1987 | Danel et al. | 73/514.21 |
| 4,999,735 | 3/1991 | Wilner | 73/718 |
| 5,337,606 | 8/1994 | Bennett | 73/514.32 |

FOREIGN PATENT DOCUMENTS

| | | |
|---|---|---|
| 2541775 | 8/1984 | European Pat. Off. . |
| 0198724 | 10/1986 | European Pat. Off. . |
| WO92/03740 | 3/1992 | WIPO . |

OTHER PUBLICATIONS

Electronic Design, Aug. 8, 1991, Frank Goodenough, "Accelerometer's Micromachined Mass Moves" in Plane of IC; On–Chip Circuit Controls it and Senses G with Force–Balance Techniques 7 pages.

IEEE, 1991, James T. Suminto, "A Simple, High Performance Piezoresistive Accelerometer", pp. 104–107.

*Primary Examiner*—Hezron E. Williams
*Assistant Examiner*—Christine K. Oda
*Attorney, Agent, or Firm*—Oblon, Spivak, McClelland, Maier & Neustadt

[57] ABSTRACT

An accelerometer with a mobile mass mechanically connected, via an insulator, to a conductive substrate by flexible beams. Mobile conductive teeth are integrally formed with the mobile mass. Fixed conductive teeth are joined to an insulator from the substrate and arranged in an alternating manner with the mobile conductive teeth. Fixed electrodes serving as an electrostatic screen are placed between the fixed teeth and the mobile teeth in such a way that each mobile tooth is intercalated between a fixed electrode and a fixed tooth so as to constitute a series of variable capacitance capacitors.

9 Claims, 1 Drawing Sheet

INTEGRATED ACCELEROMETER WITH A SENSITIVE AXIS PARALLEL TO THE SUBSTRATE

BACKGROUND OF THE INVENTION

The present invention relates to an integrated accelerometer having a sensitive axis parallel to the substrate and used for measuring the acceleration of a mobile body in a direction parallel to the substrate.

DISCUSSION OF THE BACKGROUND

Acceleration is nowadays a parameter which it is increasingly useful and necessary to know for industrial requirements, particularly in the space and aeronautical field, as well as for applications such as in cars for the inspection of active suspensions or air-bags.

The development of the latter uses requires a very significant reduction in manufacturing costs, while still maintaining acceptable metrological qualities on the part of the accelerometers.

Numerous methods have been proposed for producing accelerometers or mechanical structures for micromachined silicon accelerometers using microelectronics technologies.

The main advantage of silicon is clearly the collective treatment of the structures and their miniaturization, i.e. a relatively low cost price, but also the mechanical reliability of the monocrystalline material having no creep, hysteresis or time drift.

A distinction is made between two main groups of accelerometers as a function of the position of the sensitive axis with respect to the semiconductor substrate. Thus, there are those having structures with a sensitive axis perpendicular to the substrate and which are the most widely developed and which use conventional silicon volume anisotropic chemical machining methods. There are also structures having a sensitive axis parallel to the substrate and which are called hereinafter "parallel axis structure", whose main advantage is the possibility of integrating onto the same substrate sensitive accelerometers having two coplanar and optionally perpendicular axes. The invention relates to the second type of accelerometer. "Parallel axis" accelerometers using micromachined silicon are described in reference 1, namely Transducers' 91 Digest of Technical papers, June 1991, San Francisco "A simple, high performance piezoresistive accelerometer" by J. T. Suminto, pp. 104–107 and reference 2, i.e. U.S. Pat. No. 4,653,326 filed in the name of the present applicant.

In general terms, the basic principle used in silicon accelerometers is the measurement of the displacement or force exerted by a seismic mass attached to a support by one or more flexible mechanical links, called flexible beams.

In these known parallel axis accelerometers, the seismic mass and the flexible beams are defined by the volume machining of a silicon substrate, i.e. the entire substrate thickness is etched in order to free the mobile elements (beams and mass) of the structure.

Recently an accelerometer with its integrated electronics has been marketed and manufactured according to a surface machining method using a sacrificial oxide layer and a deposited polycrystalline silicon layer, producing the desired mechanical structure. This accelerometer is described in reference 3, i.e. Electronic Design, August 1991, pp. 45–56, "Accelerometer's micromachined mass "moves" in plane of IC; on-chip circuit controls it and senses G with force-balance techniques" by F. Goodenough.

In reference 1, the measurement of the displacement of the seismic mass is carried out by piezoresistive elements. In references 2 and 3, the possible displacements of the seismic mass are determined by a capacitive system.

The accelerometers to which the invention applies are mainly those using a capacitive detection, but they can also use a piezoresistive detection.

The known capacitive detection accelerometers suffer from the disadvantage either of necessarily using an insulating substrate, or necessarily producing an intersection of the conductors in order to connect the electrodes to the electrical contacts involving a difficult insulation between them, more particularly when said electrodes are raised to different potentials. Moreover, it is difficult to produce such insulated electrodes. These arrangements are intended to avoid the presence of a parasitic capacitance.

Moreover, in these known systems, the mobile mass is made conductive either by metallization, as described in reference 2, or by using conductive silicon. In addition, the sides of the seismic mass extending perpendicular to the displacement direction of the mass are positioned facing fixed conductive portions and define therewith, on either side of the mass, variable capacitance capacitors.

The electrical conductivity of the fixed portions can be ensured either by a metal deposit, as in reference 2, or by using conductive silicon.

In reference 3, the accelerometer has several capacitors, whose contacts are electrically insulated and whose plates are arranged in accordance with the teeth of a mobile comb positioned facing two fixed combs, so that between the plates or mobile teeth integral with the mobile mass is intercalated a plate or tooth of each fixed comb. Here again, it is difficult to produce the insulation between the crossed electrodes. This particular arrangement is also intended to avoid the presence of a parasitic capacitor associated with each mobile tooth.

The accelerometer of reference 3 uses as the mobile mass and beam polycrystalline silicon which, compared with monocrystalline silicon, leads to a reduction of the metrological qualities of the accelerometer, as well as to reproducibility and stability problems. This accelerometer also has a relatively disadvantageous shape ratio of the beams from the directivity standpoint and therefore a significant sensitivity to transverse accelerations. These disadvantages are linked with the use of polycrystalline silicon, whose deposition thickness does not exceed a few micrometres (generally below 2 pm). A limitation of the directivity of the measurement and the size of the seismic mass leads to a restricted measurement range.

SUMMARY OF THE INVENTION

The invention specifically aims at a novel integrated accelerometer having a sensitive axis parallel to the substrate making it possible to obviate the aforementioned disadvantages. In particular, this accelerometer has no intersection of conductors connecting the electrodes to the electrical contacts. It also has a better directivity, reproducibility and sensitivity than those of the prior art accelerometers, while not having a high parasitic capacitance.

To this end, the invention relates to an integrated accelerometer, characterized in that it comprises a conductive substrate, a mobile mass mechanically connected, via an insulator, to the substrate by at least one flexible beam and able to move in a first direction parallel to the substrate, the mobile mass having on at least one side conductive mobile teeth which are electrically interconnected and oriented in a second direction parallel to the substrate and perpendicular to the first direction, fixed conductive teeth which are electrically interconnected, integral and insulated with respect to the substrate, said fixed teeth being oriented in the second direction and alternate with the mobile teeth in order to form variable capacitance capacitors for measuring the displacement of the mass in the first direction and/or servocontrolling said displacements, at least one electrostatic screen formed from fingerlike fixed electrodes parallel to the second direction and which are electrically interconnected, said fixed electrodes being placed between the fixed teeth and the mobile teeth in such a way that each mobile tooth is intercalated between a fixed electrode and a fixed tooth.

In the absence of said electrostatic screen, a mobile tooth forms with the two fixed teeth surrounding it two parallel capacitors, whose capacitance varies in the inverse sense. For a good acceleration detection, it is necessary to eliminate the effect of the variation of one of these two capacitances.

The fingers and the electrostatic screen present between the fixed teeth and the mobile teeth make it possible to cancel out the parasitic capacitance variation effect and therefore obtain an increased accelerometer reliability, while ensuring a simplification of the means for processing signals supplied by the measuring means, which can be capacitive or piezoresistive. In the latter case, the variable capacitance capacitors are only used for servocontrolling the displacements of the mass.

In order to ensure good metrological qualities the mobile teeth, the fixed teeth and the fixed electrodes are made from monocrystalline silicon.

The conductivity of the fixed teeth and the mobile teeth can be ensured either by metallization of the faces of the facing teeth, or by using conductive silicon for the formation thereof. Preference is given to the use of conductive silicon.

The electrodes fulfilling the function of a screen can be made from metal. However, in order to facilitate manufacture of the accelerometer, said electrodes are made from silicon. Thus, all the mobile portions and measuring means can be made during a single etching operation of the same material.

The accelerometer according to the invention can be produced by volume etching of a conductive monocrystalline silicon substrate, or preferably using a surface technology. Preference is given to the use of a surface technology for producing the accelerometer according to the invention on standard substrates and with standard machines, so that the accelerometer costs are reduced.

BRIEF DESCRIPTION OF THE DRAWINGS

The invention is described in greater detail hereinafter relative to non-limitative embodiments and with reference to the attached drawings, wherein show.

DESCRIPTION OF THE PREFERRED EMBODIMENTS

Figure 1:
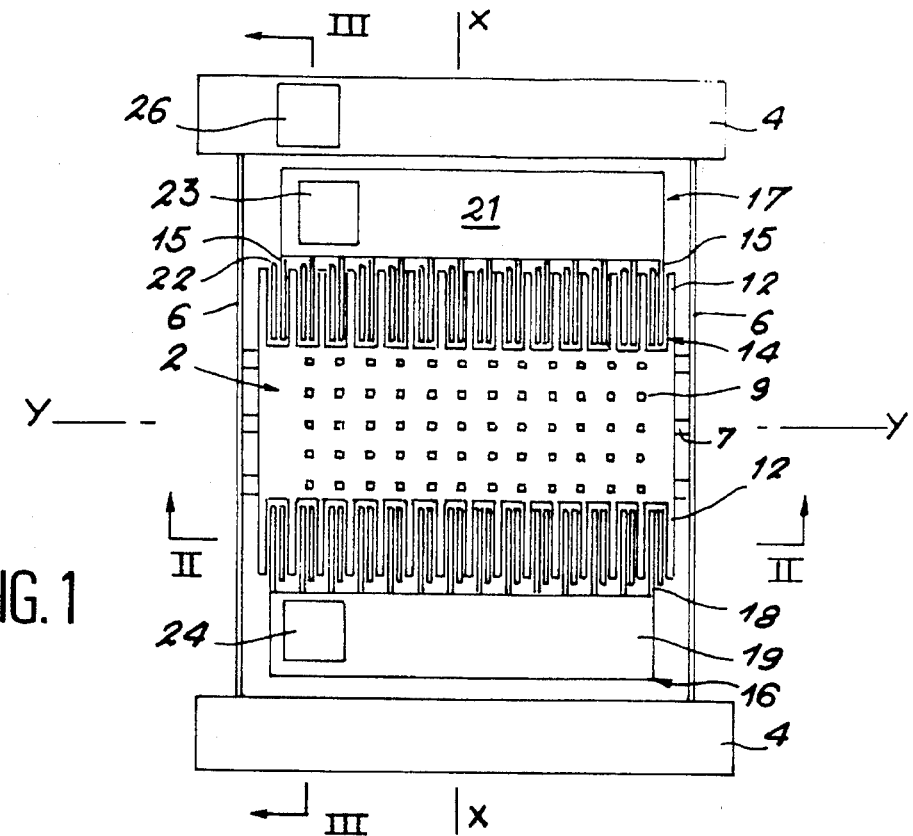
FIG. 1 diagrammatically and in plan view an accelerometer having a sensitive axis parallel to the substrate and in accordance with the invention.
Figure 2:
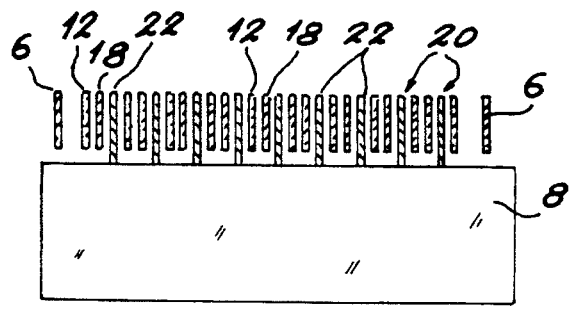
FIG. 2 a sectional view in direction II—II of FIG. 1.
Figure 3:
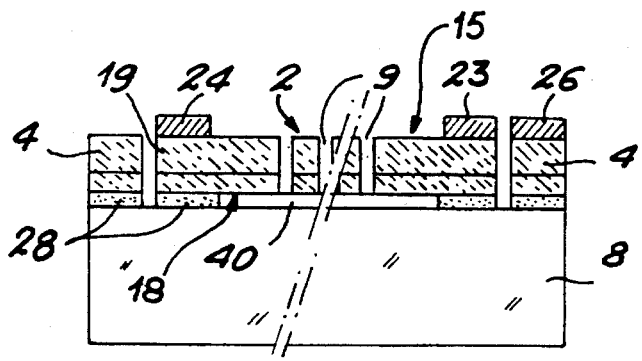
FIG. 3 a sectional view along line III—III of FIG. 1.

With reference to FIGS. 1 to 3, the accelerometer according to the invention comprises an e.g. P doped monocrystalline silicon mobile seismic mass 2, connected by flexible beams to fixed support elements 4. Said mass 2 has through holes and projecting portions 7 ensuring its connection to the beams. The elements 4 are mechanically joined and electrically insulated with respect to a substrate 8. The elements 4, the beams 6 and the substrate 8 are made from P type monocrystalline silicon.

In FIG. 1 the accelerometer has two support elements 4 on either side of the seismic mass 2, connected by beams 6 oriented perpendicular to the elements 4. Therefore this structure is symmetrical with respect to the two perpendicular axes X and Y parallel to the surface of the substrate 8. However, it is also possible to produce an accelerometer only having the upper left-hand quarter of the structure and which still functions.

The seismic mass 2 of the accelerometer of FIG. 1 has on either side of the axis Y tooth-shaped electrodes 12 oriented parallel to the direction X and constituting two first mobile combs 14. Facing and displaced with respect to each first comb 14 is provided a second fixed comb respectively 16 and 17, whose teeth 18 and 15 serving as electrodes are parallel to the direction X and are installed between the teeth 12 of the comb 14. These combs 16 and 17 are also made from P doped monocrystalline silicon and are joined to the substrate 8 by their solid portion 19, 21 (FIG. 3).

According to the invention, finger-shaped fixed electrodes 22 serving as an electrostatic screen are placed between the mobile teeth 12 and the fixed teeth 18 or 15. These fixed electrodes 22 are also arranged in comb-like manner.

As a result of the symmetry with respect to the axis Y, the accelerometer has two electrostatic screens 20 on either side of said axis. Each screen 20 is positioned in such a way that each mobile tooth 12 is intercalated between a fixed electrode 22 and a fixed tooth 18 or 15.

Each electrostatic screen 20 is made from preferably P doped, monocrystalline or polycrystalline conductive silicon and at the same time as the mass, the beams 6 and the fixed electrodes 18 and 15.

As shown in FIG. 2, the fixed electrodes 22 of the electrostatic screens are in direct contact with the substrate 8 and are therefore electrically connected to the latter. Conversely and as shown in FIG. 3, the support elements 4 of the beams 6 and the solid portions 19, 21 of the fixed combs 16, 18 are electrically insulated from the substrate 8 by an etched silicon oxide layer 28.

The seismic mass 2 is suspended above the substrate 8. The reference 40 indicates the empty space separating the seismic mass 2 from the substrate 8.

The arrangement of the electrodes or teeth 12 and 18 or 15 and that of the electrostatic screens 20 permit a differential measurement of the displacements of the mass 2 supported by the beams 6 in the direction Y, as well as a servocontrol of the measurement.

In order to measure the capacitance variations of the capacitors 12–18, a reference electric contact 23 or 24 is provided on the combs respectively 17 or 16. Moreover, an electric measuring contact 26 is provided on one of the support elements 4, in order to ensure the differential measurement.

Under the effect of an acceleration in the direction Y, the seismic mass 2 is subject to a force (F=my) making it move in accordance with the stiffness of the beams 6 by a distance 1 parallel to Y. The capacitances measured between the electrodes 12 integral with the seismic mass 2 and the fixed electrodes 18 and 15 (which serve as abutments in the case of an overload) of the "interdigitated" combs 16, 17 and 14 will vary in opposite ways.

The placing of an electrode 22 of an electrostatic screen 20 between one face of a fixed electrode 18 or 15 and one face of a mobile electrode 12 makes it possible to associate a single variable capacitance capacitor with each mobile tooth and therefore cancel out the effect of the parasitic capacitance.

From the electrical standpoint, the three series of electrodes 12, 18 or 15, 22 are insulated and under the effect of an electrical field E applied between the seismic mass 2, via the contact 26, and one of the two electrodes 18 or 15, respectively via the contact 24 or 23, an electrostatic attraction force is created.

For a servocontrol of the measurement, use is made of a measurement device connected between the contacts 24 or 23 and 26, which detects the differential capacitance variation induced by the displacement of the seismic mass in accordance with Y during an acceleration. This device of the capacitance meter type produces a low amplitude, alternating measurement signal.

On same is then superimposed a continuous polarization applied, via the contacts 24 or 23 and 26, between the electrodes 12 and 18 or 15 (which undergo a capacitance drop) making it possible to exert a force (having an electrostatic origin) equal to that created by the acceleration along Y and which brings the mass 2 to its equilibrium position and therefore to the initial capacitance of each variable capacitor.

Therefore this polarization is the image of the acceleration along Y and makes it possible to obtain an accelerometer having a very considerable linearity, while permitting the use thereof for an autotest of the structure.

The accelerometer according to the invention can be manufactured using the silicon/insulator technology and more specifically the SIMOX technology consisting of implanting oxygen ions in the P doped monocrystalline substrate at a dose of $10^{16}$ to $10^{18}$ ions/cm$^2$, followed by the annealing of the implanted structure at a temperature from 1150° to 1400° C. This gives a monocrystalline silicon film insulated from the substrate 8 by an oxide layer 28.

Then, using conventional photolithography processes, formation takes place of the beams, the mobile mass and its mobile electrodes, as well as the fixed electrodes by etching the silicon surmounting the oxide layer and then the electrostatic screens 20 in an epitaxied silicon layer. This is followed by the elimination of the oxide 28 below the seismic mass via the holes 9 and the edges by chemical etching using hydrofluoric acid.

The density of the holes permits an etching of the buried SiO$_2$ layer at a varying speed without any significant action on the supports of structure 4, 17 and 19.

We claim:

1. Integrated accelerometer comprising:

a conductive substrate, a mobile mass mechanically connected to the substrate by at least one flexible beam and an insulator, said mobile mass being movable in a first direction (Y) parallel to the substrate, the mobile mass having on at least one side conductive mobile teeth which are electrically interconnected and oriented in a second direction (X) parallel to the substrate and perpendicular to the first direction (Y), fixed conductive teeth which are electrically interconnected, integral and insulated with respect to the substrate, said fixed teeth being parallel to the second direction (X) and alternating with the mobile teeth in order to form variable capacitance capacitors for measuring displacements of the mass in the first direction or servocontrolling said displacements of the mass, at least one electrostatic screen formed from finger-like fixed electrodes parallel to the second direction (X), said fixed electrodes being electrically interconnected, each of said fixed electrodes being placed between one of said fixed teeth and one of said mobile teeth in such a way that each of said mobile tooth is intercalated between one of said finger-like fixed electrodes and one of said fixed teeth.

2. Integrated accelerometer comprising:

a conductive substrate, a mobile mass mechanically connected to the substrate by at least one flexible beam and an insulator, said mobile mass being movable in a first direction (Y) parallel to the substrate, the mobile mass having on at least one side conductive mobile teeth which are electrically interconnected and oriented in a second direction (X) parallel to the substrate and perpendicular to the first direction (Y), fixed conductive teeth which are electrically interconnected, integral and insulated with respect to the substrate, said fixed teeth being parallel to the second direction (X) and alternating with the mobile teeth in order to form variable capacitance capacitors for measuring displacements of the mass in the first direction and servocontrolling said displacements of the mass, at least one electrostatic screen formed from finger-like fixed electrodes parallel to the second direction (X), said fixed electrodes being electrically interconnected, each of said fixed electrodes being placed between one of said fixed teeth and one of said mobile in such a way that each of said mobile tooth is intercalated between one of said finger-like fixed electrodes and one of said fixed teeth.

3. Accelerometer according to claim 1 or 2, the mobile mass having two series of conductive mobile teeth arranged along two opposite sides of the mobile mass, both sides being parallel to the first direction and each series of mobile teeth being associated with a series of fixed conductive teeth and an electrostatic screen.

4. Accelerometer according to claim 1 or 2, wherein said at least one flexible beam includes two flexible beams.

5. Accelerometer according to claim 1 or 2, said mobile mass said conductive mobile teeth, said conductive fixed teeth, and said at least one electrostatic screen being made from electrically conductive monocrystalline silicon.

6. Accelerometer according to claim 4, wherein said beams are conductive and wherein an electrical insulator is placed between said beams and the substrate.

7. Accelerometer according to claim 6, wherein both electrostatic screens are in direct contact with the substrate.

8. Accelerometer according to claim 1 or 2, wherein the substrate comprises doped monocrystalline silicon.

9. Accelerometer according to claim 1 or 2, wherein said mobile mass comprises through holes.

* * * * *